US008411254B2

(12) United States Patent  (10) Patent No.: US 8,411,254 B2
De Nivelle  (45) Date of Patent: Apr. 2, 2013

(54) DEVICE MANUFACTURING METHOD, CONTROL SYSTEM, COMPUTER PROGRAM AND COMPUTER-READABLE MEDIUM

(75) Inventor: Martin Jules Marie-Emile De Nivelle, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 637 days.

(21) Appl. No.: 12/549,863

(22) Filed: Aug. 28, 2009

(65) Prior Publication Data

US 2010/0053582 A1  Mar. 4, 2010

Related U.S. Application Data

(60) Provisional application No. 61/093,515, filed on Sep. 2, 2008.

(51) Int. Cl.
G03B 27/32 (2006.01)
G03B 27/52 (2006.01)
G03B 27/42 (2006.01)

(52) U.S. Cl. .............................. 355/77; 355/53; 355/55
(58) Field of Classification Search .................... 355/53, 355/55, 77
See application file for complete search history.

(56) References Cited

U.S. PATENT DOCUMENTS

| 5,757,149 A | 5/1998 | Sato et al. | |
|---|---|---|---|
| 6,118,515 A * | 9/2000 | Wakamoto et al. | 355/53 |
| 6,674,510 B1 * | 1/2004 | Jasper et al. | 355/55 |
| 6,870,599 B2 | 3/2005 | Kurosawa | |
| 2007/0057687 A1 * | 3/2007 | Kadyshevitch et al. | 324/765 |
| 2007/0085987 A1 * | 4/2007 | Ottens et al. | 355/53 |
| 2008/0036990 A1 | 2/2008 | Hirai et al. | |

FOREIGN PATENT DOCUMENTS

| EP | 1 628 164 A2 | 2/2006 |
|---|---|---|
| EP | 1 927 893 A2 | 6/2008 |
| JP | 09-074059 A | 3/1997 |
| JP | 11-243044 A | 9/1999 |
| JP | 2000-040649 A | 2/2000 |
| JP | 2000-228344 A | 8/2000 |
| JP | 2001-057332 A | 2/2001 |
| JP | 2002-222760 A | 8/2002 |
| JP | 2008-042036 A | 2/2008 |

OTHER PUBLICATIONS

Teague, Michael Reed, "Image analysis via the general theory of moments", *Journal of the Optical Society of America*, Aug. 1980, vol. 70, No. 8, Optical Society of America, Washington, D.C.
English-Language Translation of Notice of Reasons for Rejection directed to related Japanese Patent Application No. 2009-195471, mailed Sep. 28, 2011, from the Japanese Patent Office; 2 pages.

* cited by examiner

*Primary Examiner* — Toan Ton
*Assistant Examiner* — Michelle Iacoletti
(74) *Attorney, Agent, or Firm* — Sterne, Kessler, Goldstein & Fox P.L.L.C.

(57) ABSTRACT

A device manufacturing method in a lithographic apparatus includes determining a plurality of positions on a substrate. The plurality of positions on a measurement substrate are scanned in a first direction to determine a first substrate map of the substrate levels of the measurement substrate. The plurality of positions on the measurement substrate are scanned in a second direction to determine a second substrate map of the substrate levels of the measurement substrate. A difference map is produced that includes information of the difference in measurement substrate surface level using the first substrate map and the second substrate map.

11 Claims, 3 Drawing Sheets

DEVICE MANUFACTURING METHOD, CONTROL SYSTEM, COMPUTER PROGRAM AND COMPUTER-READABLE MEDIUM

CROSS-REFERENCE TO RELATED APPLICATIONS

The present application claims the benefit under 35 U.S.C §119(e) of U.S. Provisional Patent Application No. 61/093,515, filed Sep. 2, 2008, which is incorporated herein by reference in its entirety.

FIELD

Embodiments of the present invention relate to a device manufacturing method, a control system, a computer program and a computer-readable medium.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In dual stage lithography systems, which include two (dual stage) or more substrate tables, a substrate that is to be exposed with a pattern is analyzed at a measure side of the lithographic apparatus to obtain a substrate map. The substrate map relates to the surface profile of the substrate to be exposed in the lithographic apparatus. Such a substrate map is measured with a level sensor. Based on the substrate map, optimal leveling profiles are calculated, which are to be used during exposure to compensate for the surface profile of the substrate.

After measuring the substrate map, the substrate table is then moved from the measure side to an exposure side of the lithographic apparatus, to do the exposures. During the exposures the calculated leveling profiles are used to adjust the substrate table accordingly. The executed leveling profiles are adjusted to account for, e.g., the calibrated differences between the position sensors at the measure side and the expose side of the lithographic apparatus. For immersion systems, corrections are also made for the chuck deformation due to cooling of the wafer.

During exposure, the substrate table is subjected to relatively large acceleration forces in between the actual exposure scans, which are typically executed at constant velocity. Due to the large acceleration forces the position sensor associated with the substrate table may deform. Typically, this type of position sensor includes an interferometer equipped with a mirror block of one or more mirrors which may deform.

In the constant velocity exposure scans the acceleration forces are zero. However, acceleration forces may cause a small amount of slip between the substrate table and the mirror block. Therefore, the actual shape of the substrate table can be different for a substrate map scan in a first upward direction and a scan in a second downward direction opposite to the first direction (i.e., up-scan and down-scan). This can be regarded as a time-dependent hysteretic effect. A similar effect may occur for the substrate map measurements. As a result of the deformations, focus errors will be made during exposures.

SUMMARY

It is desirable to have a system which overcomes the errors caused by the acceleration induced deformation of the position sensor.

According to an embodiment of the present invention, there is provided a device manufacturing method including the following steps: determining a plurality of positions on a substrate; scanning the plurality of positions on a measurement substrate in a corresponding plurality of first directions to determine a first substrate map of the substrate levels of the measurement substrate; scanning the plurality of positions on the measurement substrate in a corresponding plurality of second directions to determine a second substrate map of the substrate levels of the measurement substrate; and determining a difference map that includes information of the difference in measurement substrate surface level using the first substrate map and the second substrate map.

According to another embodiment of the present invention, there is provided a control system for use in a lithographic apparatus including a substrate table and a sensor system including a control system. The substrate table is constructed to hold a substrate. The sensor system measures a substrate surface level at a measuring point of the sensor system. The control system includes a control unit arranged to move the substrate table and the measurement point of the sensor system relatively, to receive measured substrate surface levels of a plurality of positions on the substrate, measured while moving the substrate table and the measurement point in a first plurality of directions corresponding to the plurality of positions, to receive measured substrate surface levels of the plurality of positions on the substrate, measured while moving the substrate table and the measurement point in a second plurality of directions corresponding to the plurality of positions, and to determine a difference map based on the difference between the measured substrate surface levels measured while scanning in the first plurality of directions and while scanning in the second plurality of directions.

According to yet another embodiment of the present invention there is provided a computer program on a computer-readable medium to be executed by a computer. The computer includes a processor and a memory. The memory is connected to the processor. The computer is part of a lithographic apparatus. The lithographic apparatus includes a substrate table constructed to hold a substrate and a sensor system for determining a substrate map of the substrate. The computer is arranged as a control system. The computer program, after being loaded, allows the processor to carry out measuring by the sensor system of a first substrate map in an up-scan and a second substrate map in a down-scan and determining a difference map which includes information of the difference in substrate surface level between the first substrate map and the second substrate map.

According to a still further aspect of the present invention, there is provided a computer-readable medium similar to the embodiment described above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
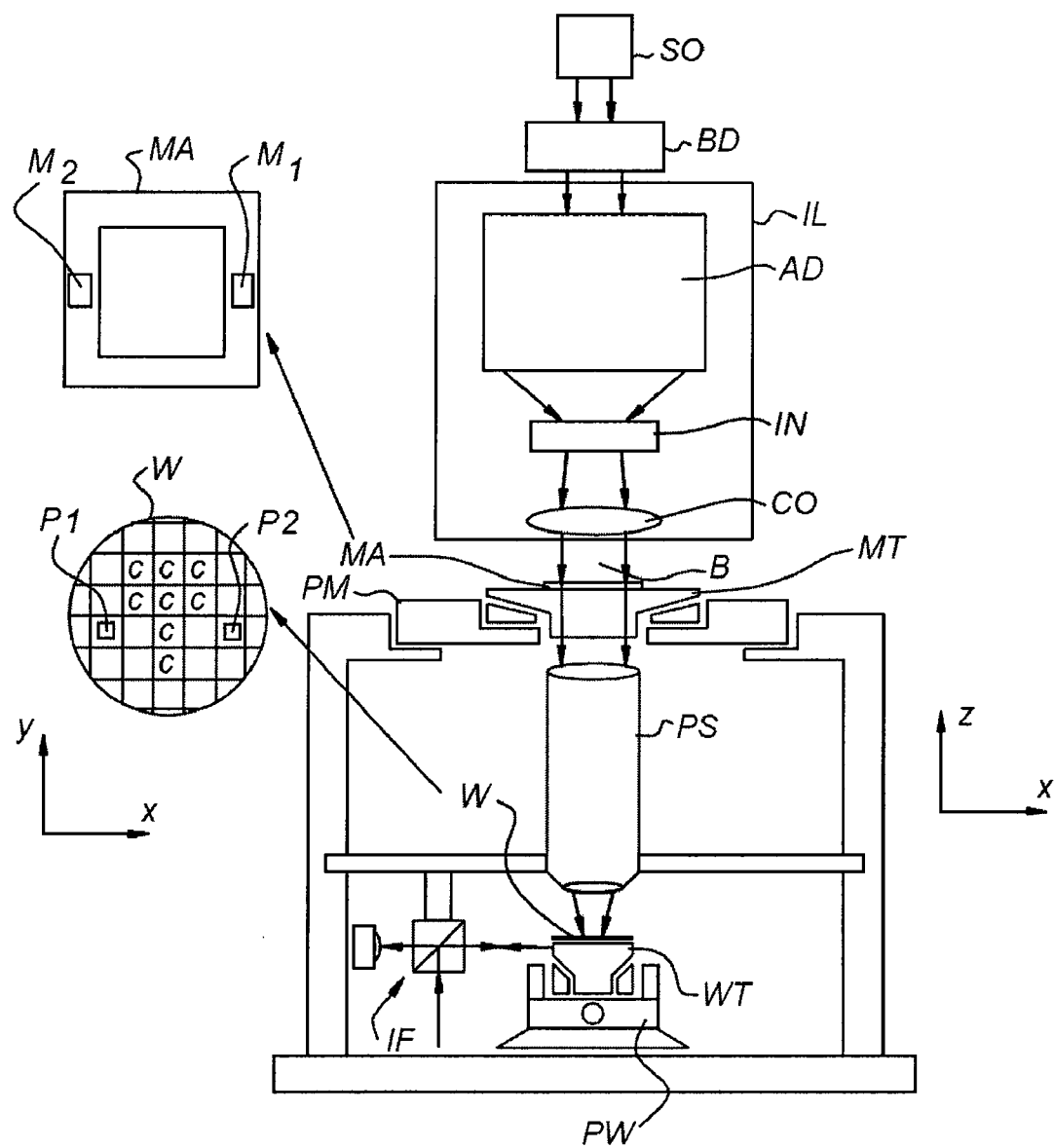
FIG. 1 depicts a lithographic apparatus, according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The lithographic apparatus includes: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. The lithographic apparatus also has a projection system PS configured to project a pattern imparted to the radiation beam B by patterning device MA onto a target portion (e.g., including one or more dies) C of the substrate W. In the lithographic apparatus the patterning device MA and the projection system PS is transmissive, but alternatively could be reflective.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus, and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

The lithographic apparatus may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus, and the radiation beam B passes from the source SO to the illuminator IL with the aid of a beam delivery system BD including, for example, suitable directing mirrors and/or a beam expander. In other cases, the source SO may be an integral part of the lithographic apparatus—for example when the source SO is a mercury lamp. The source SO and the illuminator IL, together with the beam delivery system BD, if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may include various other components, such as an integrator IN and a condenser CO. The illuminator IL may be used to condition the radiation beam B, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatus may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Figure 2:
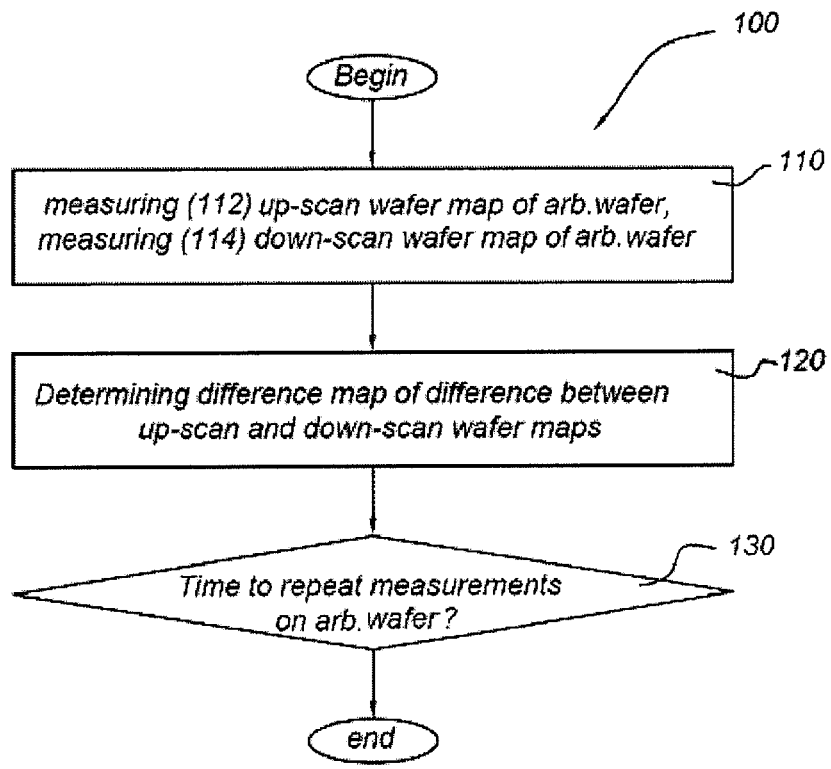
FIG. 2 depicts a flow diagram of a method, according to an embodiment of the present invention.

FIG. 2 shows a first flow diagram of a method 100, according an embodiment of the present invention.

To overcome focus errors due to acceleration force-induced deformation of the position sensor IF, in particular the mirror block of the interferometer or of one or more mirrors in the mirror block, an embodiment of the present invention provides a method 100 to be carried out in a lithographic apparatus for correcting such focus errors. In step 110, measurements are performed for substrate maps of an arbitrary wafer with both up- and down-scans in the vertical direction Y. In step 112, a first substrate map is measured in an up-scan, while in step 114 a second substrate map is measured during a down-scan.

In one example, as a result of the hysteretic effect in the position sensor IF that may occur due to the acceleration forces, the first substrate map of the up-scan may differ from the second substrate map of the down-scan.

In step 120, a determination is made to produce a difference map, which includes information of the difference in wafer surface level between the first substrate map and the second substrate map (i.e., up-scan minus down-scan).

In one example, the information of the difference in wafer surface level can be determined for each position in the first and second substrate map. Since the same wafer is measured in both the up- and down-scan, the information of the difference in wafer surface level can be associated with deformation due to acceleration forces while carrying out scanning of the wafer. In that respect the difference map can be regarded as a deformation map. In one example, the difference map can be stored in a suitable electronic memory.

Additionally, or alternatively, the first and second substrate maps can be determined over a full surface of the arbitrary wafer. The arbitrary wafer may be a test wafer preceding a production lot of wafers. Alternatively, the arbitrary wafer is a production lot wafer that is to be exposed.

Alternatively, the first and second substrate maps can be determined over only a portion of the arbitrary wafer, in which the portion of the arbitrary wafer is identical for both scans.

A substrate map of a wafer is often measured in a series of neighboring strokes, with alternating up/down scan directions. In an embodiment, the first and second wafer maps are measured in an interleaved mode. A first stroke of the first substrate map at a location on the wafer may be determined in one direction, for example, the up-scan direction, while the same stroke of the second substrate map at the same location on the wafer is then determined during the opposite scan direction.

In one example, since the hysteretic effect is time dependent, in step 110 the measurement of the substrate maps of an arbitrary wafer with both up and down-scans in the vertical direction Y can be repeated during step 130 at a given interval, after which a fresh difference map is determined.

In an embodiment, in step 110, the measurement of the up-scan and down-scan substrate maps of an arbitrary wafer is repeated substantially every day. Alternatively, the measurement of the substrate maps of an arbitrary wafer is repeated a few times a day, e.g., about every 4-6 hours. In a further alternative, the repetition interval may depend on the actual throughput of production lot wafers in the lithographic apparatus.

Figure 3:
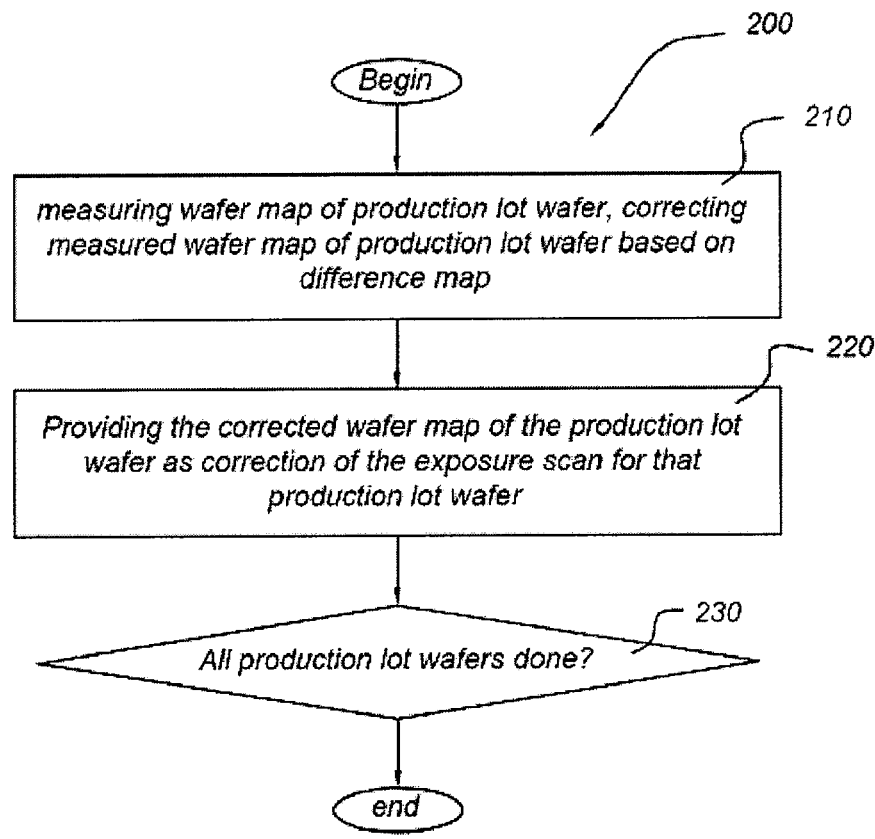
FIG. 3 depicts a second flow diagram of a method, according to an embodiment of the present invention.

FIG. 3 shows a second flow diagram of a method 200, according to an embodiment of the present invention. For example, method 200 includes a correction of substrate map measurements of one or more production lot wafers based on the difference map between up- and down-scans.

In an embodiment, in step 210, the production lot substrate map measurement of each production lot wafer in a scan direction selected from one of the up-scan and the down-scan direction is corrected. For example, in step 210 the correcting can be done by subtracting a corrective fraction of the difference map from the measured production lot substrate map. The sign of the correction is depending on the selected scan direction of the production lot wafer.

For example, if the production lot wafer scan was done in the up-scan direction and the difference is determined as up-scan measurement minus down-scan measurement, then the production lot substrate map is corrected by subtracting the difference map multiplied by the corrective fraction from the measured production lot substrate map. However, in another example, if the production lot wafer scan was done in the down-scan direction and the difference is determined as up-scan measurement minus down-scan measurement, then the production lot substrate map is corrected by adding the difference map multiplied by the corrective fraction from the measured production lot substrate map.

In one example, this is performed for each position of the substrate map. It is noted that in an alternative embodiment, a limited substrate map may be determined for a limited number of positions. In that case, the limited substrate map can be used to correct a fully measured substrate map by a scale factor. In this embodiment, it is assumed that the shape of the difference map will not change significantly. Advantageously, measuring a limited substrate map will require a shorter time than a fully measured substrate map.

Thus, a corrected production lot substrate map is obtained for each production lot wafer in either the up-scan or the down-scan direction.

In an embodiment, the corrective fraction is about 0.5.

In a further embodiment, in optional step 220, a provision of the corrected production lot substrate map is made for use during exposure of the respective production lot wafer, as a correction of the exposure scan movements of the substrate table. In optional step 230, the correction of production lot substrate map measurements of the production lot wafer based on the difference map between up and down-scans, can be repeated for each production lot wafer being processed in the lithographic apparatus.

Figure 4:
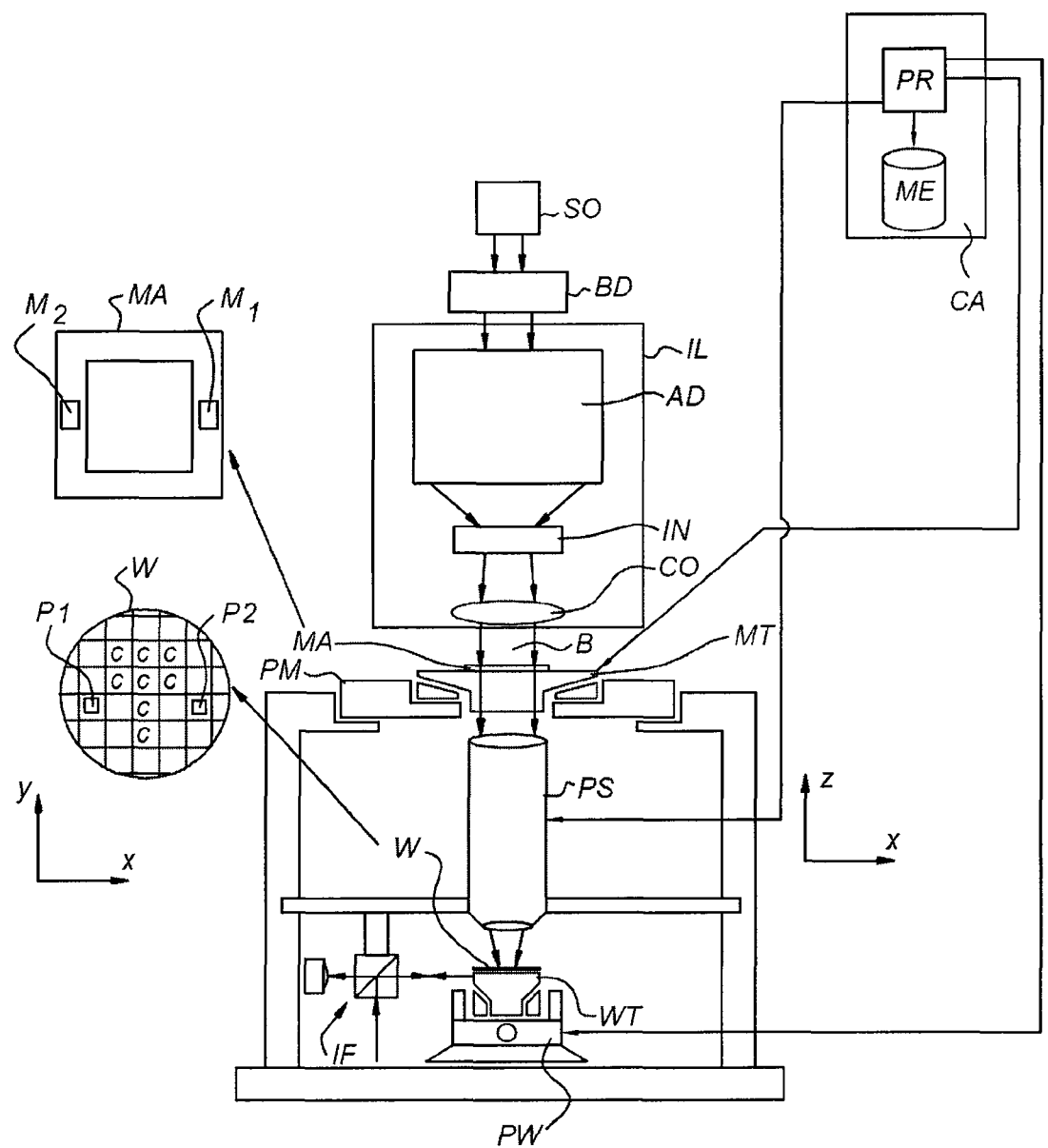
FIG. 4 depicts a lithographic apparatus including a computer system, in accordance with an embodiment of the present invention.

FIG. 4 shows an embodiment of a lithographic apparatus, similar to that shown in FIG. 1, which is arranged for carrying out the method of an embodiment of the present invention. In this embodiment, the lithographic apparatus includes a control system that is capable of controlling required adjustments for correcting errors caused by the acceleration-induced deformation of the position sensor. In one example, the control system relates to a computer system CA including a processor PR for performing arithmetical operations and a memory ME. The processor PR is arranged to communicate with memory ME. Memory ME may be any type of memory arranged to store instructions and data, such as, but not limited to, a tape unit, a hard disk, Read Only Memory (ROM), Non Volatile Random Access Memory (NVRAM) and Random Access Memory (RAM).

In one example, the processor PR may be arranged to read and execute programming lines stored in the memory ME providing the processor PR with the functionality to perform the reticle alignment adjustments as will be described in more detail below. The processor PR may be specially provided to perform the described embodiment of the method, but may also be a central processor arranged to control the lithographic apparatus as a whole and now is provided with additional functionality to perform the described embodiment of the method.

In one example, the computer system CA is connected to sensors for sensing information related to the wafermap of a substrate, while being on the measuring side of the dual stage lithographic apparatus, and for sensing information related to the position of the substrate table WT. Additionally, or alternatively, the computer system CA is arranged to carry out an embodiment of the method of the invention, after loading computer program code into the memory ME.

In one example, the computer program code includes machine-readable instructions that allow the processor PR to carry out: measuring substrate maps of an arbitrary wafer with both up and down-scans in the vertical direction Y (step 110), measuring a first substrate map is measured in an up-scan (step 112), while a second substrate map is measured during a down-scan (step 114), determining a difference map which includes information of the difference in wafer surface level between the first substrate map and the second substrate map (i.e., up-scan minus down-scan) (step 120). The difference map can be stored in memory.

It is noted that the information of the difference between the first and the second substrate map may be the actual difference for each measured position. Alternatively, the information of the difference between the first and the second substrate map is represented by a fit function, fit parameters of the fit function being determined from the measured difference between the first and the second substrate map measured by the sensor system. The fit function describes the difference map as a function of the position on the substrate map. In the latter case, the fit parameters have been determined from fitting the difference map data to the fit function. For example, the fit function is a polynomial function.

Additionally, the processor may be arranged for repeating step 110, i.e., the measurement of the substrate maps of an arbitrary wafer with both up and down-scans at a given interval, after which a fresh difference map is determined.

In an embodiment, the processor is arranged for repeating step 110, i.e., the measurement of the substrate maps of an arbitrary wafer, substantially every day. Alternatively, the processor may be arranged for measurement of the substrate maps of an arbitrary wafer a few times a day, e.g., about every 4-6 hours. In a further alternative, the repetition interval may be dependent on the actual throughput of production lot wafers in the lithographic apparatus.

In one example, the processor PR can be arranged for carrying out step 210, i.e., correction of substrate map measurements of one or more production lot wafers based on the difference map between the up and down-scans.

In an embodiment, correcting substrate map measurements is done by subtracting or adding a corrective fraction of the difference map from/to the measured production lot substrate map. The sign of the correction depends on the selected scan direction of the production lot wafer, as was described above in more detail. In the alternative embodiment, in which the difference map is represented by fit parameters, the correction for each position on the substrate map is computed using the fit function with the fit parameters determined earlier and as a function of the actual scan direction (up or down).

In an embodiment, the corrective fraction is about 0.5.

In a further embodiment, the processor carries out step 220, i.e., providing the corrected production lot substrate map for use during exposure of the respective production lot wafer, as a correction of the exposure scan movements of the substrate table.

In another embodiment, the processor may be arranged for carrying out step 230, i.e., repeating correction of substrate map measurements for each production lot wafer being processed in the lithographic apparatus.

In respect to an embodiment performing corrections during exposure it is noted that the lithographic apparatus includes an exposure system to expose the substrate to a patterned beam of radiation, such that the controller (or processor) is arranged to provide a correction of relative positions of the substrate and the patterned beam of radiation. The correction is based on the difference map.

In an embodiment, the exposure system of the lithographic apparatus includes a source for generating a beam of radiation, a reticle being capable of imparting the beam of radiation with a pattern in its cross-section to form a patterned radiation beam, and a projection system configured to project the patterned radiation beam onto a target portion of the substrate.

In a further embodiment, the controller is connected to at least one member of a first group including the substrate table and the projection system. The controller is arranged to control an action of the at least one member for controlling relative positions between the at least one member and another member of the first group. This allows a first type of correction relating to a position of the substrate and a position of an image generated by the projection system.

In yet a further embodiment, the controller is connected to a support structure for supporting a second member including one of a second group including the reticle and a programmable patterning device. The controller is arranged to control an action of the support structure for controlling a position of the second member, based on the difference map. This allows a second type of corrections relating to the position of the reticle (or programmable patterning device).

Also, the controller may be arranged for controlling relative positions between a member of the first group and a member of the second group.

It should be understood that there may be provided a computer system having more and/or other units, such as memory units, input devices and read devices known to persons skilled in the art. Moreover, one or more of them may be physically located remote from the processor PR, if required. Additionally or alternative, although the processor PR is shown as one box, the processor may include several processing units functioning in parallel or controlled by one main processor PR that may be located remote from one another, as is known to persons skilled in the art.

It is observed that, although all connections in the figures are shown as physical connections, one or more of these connections can be made wireless. They are only intended to show that "connected" units are arranged to communicate with one another in someway. The computer system can be any signal processing system with analog and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A device manufacturing method comprising:
   scanning a plurality of positions on a measurement substrate in a first direction to determine a first substrate map;
   scanning a plurality of positions on the measurement substrate in a second direction to determine a second substrate map, wherein strokes of the first substrate map are scanned interleaved with strokes of the second substrate map;
   determining a difference map comprising information corresponding to a difference between the first substrate map and the second substrate map;
   exposing the substrate to a patterned beam of radiation; and
   controlling the relative positions of the substrate and the patterned beam of radiation based upon the determined difference map.

2. The method of claim 1, further comprising:
   producing a measured production lot substrate map by scanning a plurality of positions on a production lot substrate in the first direction; and
   producing a corrected production lot substrate map by correcting the measured production lot substrate map based on the difference map.

3. The method of claim 2, wherein the measurement substrate is a production lot substrate.

4. The method of claim 2, wherein the measured production lot substrate map is corrected by subtracting a corrective fraction of the difference map.

5. The method of claim 2, further comprising:
   using the corrected production lot substrate map during exposure of the respective production lot substrate to accurately position the production lot substrate in a beam of exposure radiation.

6. The method of claim 1, wherein the first direction is opposite to the second direction.

7. A system for use in a lithographic apparatus comprising:
   a substrate table constructed to hold a substrate;
   an exposure system configured to expose the substrate to a patterned beam of radiation;
   a sensor system configured to measure a substrate surface at a measuring point of the sensor system; and
   a control system comprising a control unit arranged to:
   move at least one of the substrate table and the measurement point of the sensor system relatively,
   receive first measured substrate surface levels of a plurality of positions on the substrate, measured while moving at least one of the substrate table and the measurement point in a plurality of first directions corresponding to the plurality of positions,
   receive second measured substrate surface levels of the plurality of positions on the substrate, measured while moving at least one of the substrate table and the measurement point in a plurality of second directions corresponding to the plurality of positions, wherein strokes of the first measured substrate surface levels are measured interleaved with strokes of the second measured substrate surface levels,
   determine a difference map based on the difference between the first and second measured substrate surface levels, and
   control the relative positions of the substrate and the patterned beam of radiation based upon the determined difference map.

8. The system of claim 7, wherein the control unit is:
   connected to the substrate table or a projection system; and
   configured to control relative positions between the substrate table and the projection system based on the difference map.

9. The system of claim 8, wherein the control unit is:
   connected to a support structure for supporting the reticle or a programmable patterning device; and
   configured to control an action of the support structure for controlling a position of the reticle or the programmable patterning device based on the difference map.

10. The system of claim 9, wherein the control unit is further configured to control positions of at least one of the substrate table and the projection system relative to a position of the programmable patterning device or the reticle.

11. A non-transient computer-readable storage medium having a computer program code recorded thereon that, when executed by a processor, causes the processor to perform a method, the method comprising:
   scanning a plurality of positions on a measurement substrate in a first direction to determine a first substrate map;
   scanning a plurality of positions on the measurement substrate in a second direction to determine a second substrate map, wherein strokes of the first substrate map are scanned interleaved with strokes of the second substrate map;
   determining a difference map comprising information corresponding to a difference between the first substrate map and the second substrate map;
   exposing the substrate to a patterned beam of radiation; and
   controlling the relative positions of the substrate and the patterned beam of radiation based upon the determined difference map.

* * * * *